(12) United States Patent
Song et al.

(10) Patent No.: US 8,282,771 B2
(45) Date of Patent: Oct. 9, 2012

(54) METHOD OF PROCESSING A SUBSTRATE, SPIN UNIT FOR SUPPLYING PROCESSING MATERIALS TO A SUBSTRATE, AND APPARATUS FOR PROCESSING A SUBSTRATE HAVING THE SAME

(75) Inventors: Gil-Hun Song, Cheonan-si (KR); Pyeng-Jae Park, Cheonan-si (KR)

(73) Assignee: Semes Co., Ltd., Cheonan-si (KR)

( * ) Notice: Subject to any disclaimer, the term of this patent is extended or adjusted under 35 U.S.C. 154(b) by 1058 days.

(21) Appl. No.: 12/211,229

(22) Filed: Sep. 16, 2008

(65) Prior Publication Data

US 2009/0075484 A1    Mar. 19, 2009

(30) Foreign Application Priority Data

Sep. 19, 2007   (KR) .................. 10-2007-0095172

(51) Int. Cl.
   *C23F 1/08*   (2006.01)
   *H01L 21/68*   (2006.01)

(52) U.S. Cl. ........................ 156/345.55; 156/345.21

(58) Field of Classification Search .......... 156/345.21, 156/345.55; 134/149, 153, 157, 902
See application file for complete search history.

(56) References Cited

U.S. PATENT DOCUMENTS

| 5,591,262 A | * | 1/1997 | Sago et al. ............... 118/52 |
| 2002/0142595 A1 | | 10/2002 | Chiou | |

FOREIGN PATENT DOCUMENTS

| JP | 11-111673 | | 4/1999 |
| JP | 11176795 A | * | 7/1999 |
| JP | 2002-353182 | | 5/2001 |
| JP | 2002-028585 | | 1/2002 |
| JP | 2002064078 A | * | 2/2002 |
| JP | 2002-124504 | | 4/2002 |
| JP | 2002-158202 | | 5/2002 |
| KR | 2006-61816 | | 6/2006 |

OTHER PUBLICATIONS

Machine Generated English Translation of JP 11-111673 to Iso Akimori et al published Apr. 23, 1999.*
Machine Generated English Translation of JP 2002-158202 to Mayuzumi Masanori et al. Published May 31, 2002.*
Machine Generated English Translation of JP 11-176795 to Izumi et al. Publised Jul. 2, 1999.*
Machine Generated English Translation of JP 2002-028585 to Mizukawa Shigeru e al published Jan. 29, 2002.*
Machine Generated English Translation of JP 2002-064078 published Feb. 28, 2002 to Lindner.*

(Continued)

*Primary Examiner* — Sylvia R. MacArthur
(74) *Attorney, Agent, or Firm* — Daly, Crowley, Mofford & Durkee, LLP (57) ABSTRACT

In a spin unit for rotating a substrate and a method of processing the substrate, the substrate is secured on a support and is rotated on the support. Processing materials including drying gases, etching solutions and cleaning solutions are selectively supplied onto a bottom surface of the rotating substrate. The same processing materials are also selectively supplied onto a top surface of the substrate. The top and bottom surfaces of the substrate are simultaneously processed by simultaneous supply of the processing materials through the first and second sub-injectors.

13 Claims, 4 Drawing Sheets

OTHER PUBLICATIONS

Japanese Office Action dated Jul. 12, 2011, for Japanese Patent Application No. 2008-241478, 5 pages, and letter enclosing Japanese Office Action dated Jul. 12, 2011.
Chinese Office Action dated Sep. 11, 2009, for counterpart Chinese Patent Application No. 2008-10166304.X of priority Korean Application No. 2007-95172, from which present U.S Application also claims priority.
Korean Office Action dated Oct. 29, 2008 on Korean Patent Application No. 2007-95172.

* cited by examiner

METHOD OF PROCESSING A SUBSTRATE, SPIN UNIT FOR SUPPLYING PROCESSING MATERIALS TO A SUBSTRATE, AND APPARATUS FOR PROCESSING A SUBSTRATE HAVING THE SAME

PRIORITY STATEMENT

This application claims priority under 35 U.S.C. §119 to Korean Patent Application No. 2007-95172, filed on Sep. 19, 2007 in the Korean Intellectual Property Office (KIPO) the contents of which are herein incorporated by reference in their entirety.

BACKGROUND OF THE INVENTION

1. Field of the Invention

Example embodiments of the present invention relate to a method of processing a substrate, a spin unit for supplying processing materials to the substrate, and an apparatus for processing a substrate having the same. More particularly, example embodiments of the present invention relate to a method of simultaneously processing bottom and top surfaces of a substrate, a spin unit for supplying processing materials to the bottom surface of the substrate, and an apparatus for processing a substrate having the spin unit.

2. Description of the Related Art

In general, integrated circuit devices such as semiconductor memory devices are manufactured through various repeated unit processes on a semiconductor substrate such as a silicon wafer. For example, the integrated circuits are manufactured through an etching process for etching the substrate, a cleaning process for cleaning various contaminants and a drying process for drying processing materials in the etching process and the cleaning process.

An injection member has been widely used in the above unit processes such as the etching process, the cleaning process and the drying process so as to inject the processing materials, e.g., etching solutions, cleaning solutions and drying gases onto the substrate. In a conventional structure of an apparatus for the unit process, the injection member is positioned over the substrate and the processing materials are injected onto a top surface of the substrate through the injection member. Then, the processing materials on the top surface of the substrate generally spread out on the entire top surface of the substrate uniformly due to centrifugal force, because the substrate is rapidly rotated at a high angular velocity. That is, the processing materials on the substrate generally flow out towards a peripheral portion of the substrate and some of the processing materials flow off of the substrate. As a result, some of the processing materials flow onto a bottom surface of the substrate along a side surface thereof. The processing materials on the bottom surface of the substrate may cause various particles and defects.

For that reason, a cleaning member and a drying gas are positioned under a bottom surface of the substrate, and thus the residual processing materials are removed from the bottom surface of the substrate by the cleaning member and the drying gas. For example, deionized water and nitrogen ($N_2$) gases have been widely used as a cleaning solution for the cleaning process and a drying gas for the drying process, respectively. However, the cleaning member and the drying gas merely performs the cleaning process and the drying process to the bottom surface of the substrate, and thus other process such as an additional etching process is difficult to be performed to the bottom surface of the substrate without any variation of the substrate.

So as to perform a process on the bottom surface of the substrate, the substrate is turned over and the etching solutions are injected onto the bottom substrate through the injection member over the substrate. Therefore, an addition member for turning over the substrate is required for processing the substrate, and the additional member necessarily requires an additional space to thereby decrease space efficiency of an apparatus for processing the substrate.

SUMMARY OF THE INVENTION

An example embodiment of the present invention provides a method of simultaneously processing top and bottom surfaces of a substrate.

Another example embodiment of the present invention provides a spin unit for supplying processing materials onto the bottom surface of the substrate.

Still another example embodiment of the present invention provides an apparatus for processing the substrate having the above-mentioned spin unit.

According to some example embodiments of the present invention, there is provided a method of processing a substrate. The substrate may be secured on a support and may be rotated on the support. Processing materials may be selectively supplied onto a bottom surface of the rotating substrate and the same processing materials may also be selectively supplied onto a top surface of the rotating substrate.

In an example embodiment, the step of supplying the processing materials onto the bottom surface of the substrate includes injecting the processing materials onto a center portion and a central neighboring portion adjacent to the center portion of the bottom surface at a position spaced apart from the bottom surface by a gap distance.

In an example embodiment, the processing materials includes drying gases, etching solutions and cleaning solutions and the drying gases are injected at a first position spaced apart from the bottom surface by a first gap distance and the etching solutions and the cleansing solutions are injected at a second position spaced apart from the bottom surface by a second gap distance greater than the first gap distance.

In an example embodiment, the drying gases are injected onto the center portion of the bottom surface of the substrate, and the etching solutions and the cleaning solutions are injected onto the central neighboring portion of the bottom surface of the substrate.

In an example embodiment, the etching solutions and the cleaning solutions are injected onto the bottom surface in a first direction and the drying gases are injected onto the bottom surface in a second direction different from the first direction.

In an example embodiment, the step of supplying the processing materials onto the bottom surface and the step of supplying the processing materials onto the top surface of the substrate are simultaneously performed.

According to some example embodiments of the present invention, there is provided a spin unit includes a rotating part on which a substrate is rotated, a support positioned on a peripheral portion of an upper surface of the rotating part and supporting the substrate, and an injector positioned on the upper surface of the rotating part and spaced apart from a bottom surface of the substrate. Processing materials are selectively injected onto the bottom surface of the substrate through the injector while the substrate is rotated.

In an example embodiment, the processing materials includes drying gases, etching solutions and cleaning solutions and the injector includes a first sub-injector located at a center portion of the upper surface of the rotating part and spaced apart from a bottom surface of the substrate by a first gap distance, the drying gases being injected onto the bottom surface of the substrate through the first sub-injector, and a second sub-injector located at a central neighboring portion of the upper surface of the rotating part and spaced apart from the bottom surface of the substrate by a second gap distance, the etching solutions and the cleaning solutions being injected onto the bottom surface of the substrate through the second sub-injector.

In an example embodiment, the second gap distance is greater than the first gap distance. For example, a ratio of the first and the second gap distance is in a range of about 1:2 to about 1:4.

In an example embodiment, the first and second gap distances are respectively controlled independently from each other.

In an example embodiment, a plurality of the second sub-injectors is located around the first sub-injector, so that the first sub-injector is enclosed by the second sub-injectors.

In an example embodiment, the first and the second sub-injectors inject the processing materials onto the bottom surface of the substrate in a direction substantially vertical to the substrate. Otherwise, the first and the second sub-injectors inject the processing materials onto the bottom surface of the substrate in different directions, so that the drying gases are injected through the first sub-injector in a first direction and the etching solutions and the cleaning solutions are injected through the second sub-injector in a second direction different from the first direction.

In an example embodiment, the injector further includes a cap enclosing lower portions of the first and second sub-injectors of the injector, so that the processing materials that are injected through the injector are prevented from remaining at the lower portions of the first and second sub-injectors after rebounding from the substrate. A peripheral portion of the cap is inclined downward in a left-to-right hatch direction at an angle with respect to a bottom surface of the cap.

According to some example embodiments of the present invention, there is provided an apparatus for processing a substrate including a spin unit including a rotating part on which a substrate is rotated, a support positioned on a peripheral portion of an upper surface of the rotating part and supporting the substrate, and a lower injector positioned on the upper surface of the rotating part and spaced apart from a bottom surface of the substrate, and an upper injector located over the substrate. Processing materials are selectively supplied onto the bottom surface of the substrate through the lower injector while the substrate is rotated and the processing materials are selectively supplied onto a top surface of the substrate through the upper injector while the substrate is rotated.

In an example embodiment, the processing materials includes drying gases, etching solutions and cleaning solutions and the lower injector includes a first sub-injector located at a center portion of the upper surface of the rotating part and spaced apart from a bottom surface of the substrate by a first gap distance, and a second sub-injector located at a central neighboring portion of the upper surface of the rotating part and spaced apart from the bottom surface of the substrate by a second gap distance. The drying gases being injected onto the bottom surface of the substrate through the first sub-injector and the etching solutions and the cleaning solutions being injected onto the bottom surface of the substrate through the second sub-injector.

In an example embodiment, the drying gases are injected onto the bottom surface of the substrate through the first sub-injector in a first direction and the etching solutions and the cleaning solutions are injected onto the bottom surface of the substrate through the second sub-injector in a second direction different from the first direction.

In an example embodiment, the lower injector further includes a cap enclosing lower portions of the first and the second sub-injectors of the injector and of which a peripheral portion is inclined downward in a left-to-right hatch direction at an angle with respect to a bottom surface of the cap, so that the processing materials that are injected through the injector are prevented from remaining at the lower portions of the first and the second sub-injectors after rebounding from the substrate.

In an example embodiment, the lower and the upper injectors simultaneously inject the processing materials onto the bottom surface and the top surface of the substrate, respectively.

According to some example embodiments of the present invention, processing materials may be supplied onto a bottom surface of a substrate. Particularly, the processing materials may be selectively injected onto the bottom surface of the substrate at a position spaced apart from the bottom surface, and thus the processing materials may be uniformly injected onto the bottom surface of the substrate. Further, etching solutions or cleaning solutions may be injected at an inclined angle toward a peripheral portion of the substrate, to thereby prevent clogging of an injector due to rebounded etching solutions and cleaning solutions. Furthermore, particles caused by the flowing off of the processing materials from the top surface of the substrate may be sufficiently prevented by simultaneous injection through lower and upper injectors.

BRIEF DESCRIPTION OF THE DRAWINGS

Example embodiments will be more clearly understood from the following detailed description taken in conjunction with the accompanying drawings. FIGS. 1 to 6 represent non-limiting, example embodiments as described herein.

DETAILED DESCRIPTION OF THE INVENTION

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above,", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 1:
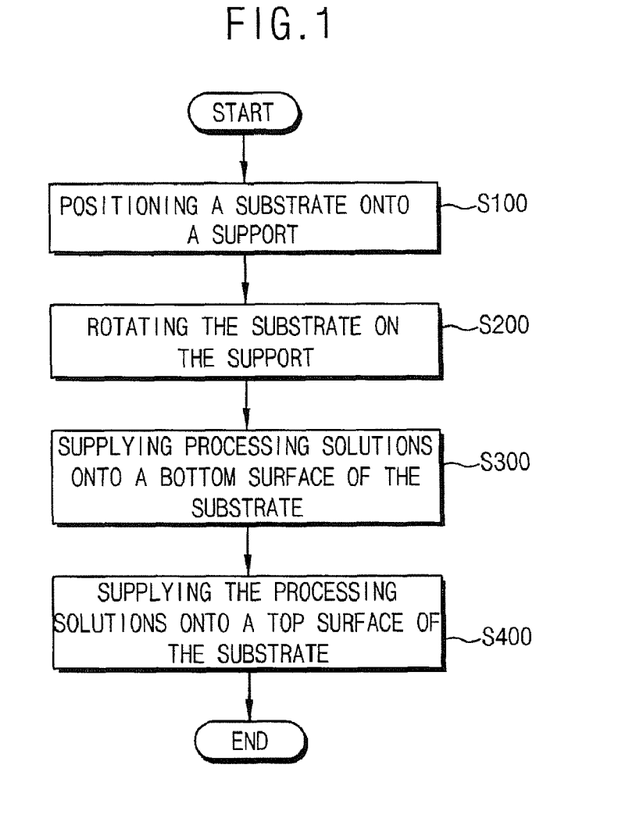
FIG. 1 is a flowchart showing a method of processing a substrate in accordance with an example embodiment of the present invention.

FIG. 1 is a flowchart showing a method of processing a substrate in accordance with an example embodiment of the present invention.

Referring to FIG. 1, a substrate that is to be processed may be loaded into a process chamber (step S100), and then the substrate is rotated in the process chamber (step S200). Processing materials such as etching solutions, cleaning solutions and drying gases may be supplied onto the substrate (step S300). The same processing materials may be supplied onto a top surface of the substrate (step S400).

In an example embodiment, the substrate may be loaded into the process chamber and be positioned on a support, to thereby be ready for a series of unit processes (step S100). In the present example embodiment, a peripheral portion of the bottom surface of the substrate may be supported by the support, so that the bottom surface as well as the top surface of the substrate may be processed in the process chamber. The substrate may also be positioned on the support in such a configuration that a peripheral portion of the substrate is secured to a fixing unit. Otherwise, the substrate may also be absorbed by a vacuum absorber at the bottom surface thereof.

The substrate may be rotated in a counterclockwise or a clockwise direction, and thus the entire surface of the substrate may be processed efficiently (step S200). For example, when the processing materials are supplied onto a portion of the substrate, the processing materials may spreads over uniformly on the entire surface of the substrate due to centrifugal force on the substrate. The rotation direction and a rotation speed of the substrate may be varied in accordance with a kind of the process and a kind and an amount of the processing solution.

The processing materials may be supplied onto the bottom surface of the substrate. The processing materials may include an etching solution, a cleaning solution and drying gas that are selected in accordance with the process performed to the substrate. The etching solution may include a standard cleaning 1 (SC-1) solution, a diluted sulfuric peroxide (DSP) solution and a diluted hydrogen fluoride (DHF) solution. The cleaning solution may include deionized pure water. The drying gas may include nitrogen ($N_2$) gas for drying the etching solutions or the cleaning solutions. The processing materials may be selectively injected onto the bottom surface of the substrate in accordance with processing steps of the process to the substrate.

In the present example embodiment, the processing materials may be injected onto the bottom surface of the substrate at a position spaced apart from the substrate by a gap distance (step S300). In such a case, a first gap distance by which the etching solutions or the cleaning solutions are injected onto the bottom surface of the substrate may be different from a second gap distance by which the drying gases are injected onto the bottom surface of the substrate, and thus the drying gases may not be interrupted by the etching solutions or the cleaning solutions. When the first gap distance is the same as the second gap distance, the etching solutions or the cleaning solutions may be guided to the drying gases since an injection pressure of the drying gases is lower than that of the etching solutions or the cleaning solutions. That is, the etching solutions or the cleaning solutions may be followed by the drying gases.

For that reason, the second gap distance may be controlled to be smaller than the first gap distance, so that the drying gases may be injected onto the substrate much closer to the substrate than the etching solutions or the cleaning solutions. For example, the ratio of the second gap distance with respect to the first gap distance may range from about 3:5 to about 4:5. When the ratio of the second gap distance with respect to the first gap distance is less than about 2:5, the drying gases are injected onto the substrate from a distance so close to the substrate that the drying gases are likely to rebound back to the injection member for the drying gases. In addition, when the etching gases or the cleaning gases are injected to the substrate sufficiently away from the substrate, the injection pressure of the etching solutions or the cleaning solutions may need to be increased. In the present example embodiment, the drying gases may be injected onto the substrate at the second gap distance of about 6 mm to about 8 mm from the bottom surface of the substrate, and the etching solutions or the cleaning solutions may be injected onto the substrate at the first gap distance of about 10 mm to the bottom surface of the substrate.

Accordingly, the processing materials including the etching solutions, the cleaning solutions and the drying gases may uniformly spread out on the entire bottom surface of the substrate.

In an example embodiment, the processing materials may be supplied onto a center portion of the substrate or a central neighboring portion of the substrate that is adjacent to the center portion. That is, the processing materials may be vertically injected onto the center portion of the bottom surface of the substrate. Otherwise, the processing materials may be injected onto the central neighboring portion of the bottom surface of the substrate. Since the drying gases may be lighter than the etching solutions or the cleaning solutions and may easily rebound from the bottom surface of the substrate, the drying gases, rather than the etching solutions or the cleaning solutions, may be injected onto the center portion of the bottom surface of the substrate. Therefore, the etching solutions, the cleaning solutions and the drying gases may uniformly spread out the entire bottom surface of the substrate due to the rotation of the substrate.

In an example embodiment, the injection of the drying gases and the injection of the etching solutions or the cleaning solutions may be performed in different directions. For example, the etching solutions and the cleaning solutions may be injected onto the bottom surface of the substrate obliquely with respect to an injection direction of the drying gases which is perpendicular to the bottom surface of the substrate, toward the peripheral portion of the substrate. When the etching solutions or the cleaning solutions are vertically injected onto the bottom surface of the substrate similarly to the drying gases, the etching solutions and the cleaning solutions may easily rebound from the bottom surface of the substrate back to an injection unit for the etching solutions and the cleaning solutions may be clogged with the rebounded etching and cleaning solutions. That is, the oblique injection of the etching solutions or the cleaning solutions may sufficiently prevent clogging of the injection unit for the etching solutions or the cleaning solutions.

The same processing materials injected onto the bottom surface of the substrate may be selectively injected onto the top surface of the rotating substrate (step S400). For example, the same processing materials may be supplied onto the bottom surface and the top surface of the substrate. In the present example embodiment, the injection onto the bottom surface and the injection onto the top surface of the substrate may be performed at the same time, so that the processing materials injected onto the top surface of the substrate may be prevented from flowing downward to the bottom surface of the substrate. Therefore, the particles generated on the bottom surface due to the processing materials on the top surface may be sufficiently minimized by the simultaneous injection of the processing materials to both the top and bottom surfaces of the substrate.

According to an example embodiment of the present example embodiment, the processing materials may be selectively injected onto the rotating substrate at a position spaced apart from the bottom surface of the substrate, and thus the processing materials may uniformly spread out on the entire bottom surface of the substrate. Further, the etching solutions and the cleaning solutions may be obliquely injected to the bottom surface of the substrate, the injection unit for the etching solutions or the cleaning solutions may be sufficiently prevented from being clogged by the rebounded etching solutions or the cleaning solutions from the bottom surface of the substrate. Furthermore, simultaneous injection of the processing materials to both the top and bottom surfaces of the substrate may prevent the particles from being generated on the bottom surface due to the processing materials on the top surface.

Figure 2:
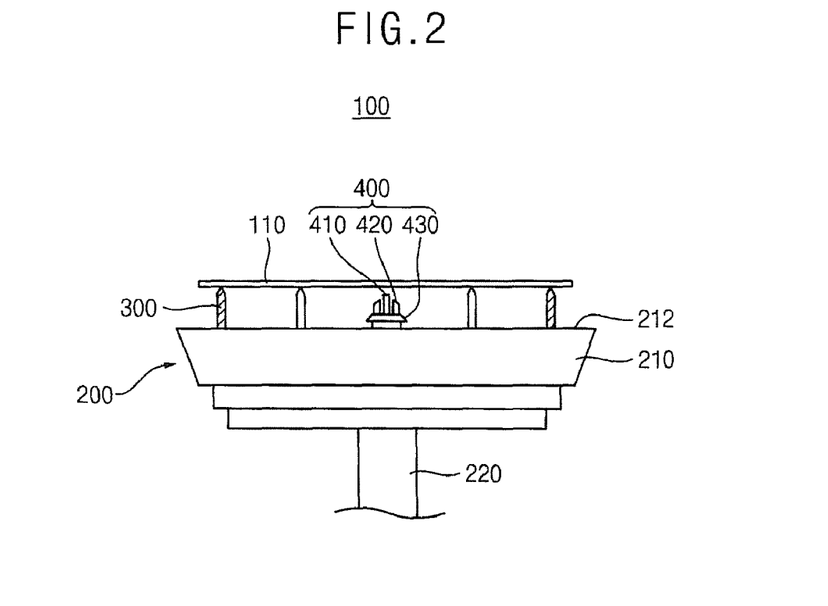
FIG. 2 is a cross-sectional view illustrating a schematic structure of a spin unit in accordance with an example embodiment of the present invention.

FIG. 2 is a cross-sectional view illustrating a schematic structure of a spin unit in accordance with an example embodiment of the present invention.

Referring to FIG. 2, the spin unit 100 may include a rotating part 200, a support 300 and an injector 400.

The rotating part 200 may rotate the substrate 110 and may include a spin chuck 210 and a rotating axle 220.

The spin chuck 210 may have a flat top surface and may be shaped in view of a shape and the size of the substrate 110. In the present example embodiment, the size of the spin chuck 210 may be larger than that of the substrate 110. The rotating axle 220 may be positioned at a center portion of a bottom surface of the spin chuck 210 and extend downward to a motor (not shown). Therefore, the motor drives the rotating axle 220 to rotate and the spin chuck 210 rotates in a counterclockwise or a clockwise direction as the rotation of the axle 220. That is, the substrate 110 may be rotated in a counterclockwise or a clockwise direction by the rotating part 200.

The support 300 may support the substrate 110 and may be arranged on a peripheral portion of the top surface of the rotating part 200. For example, a plurality of the supports 300 may be located on the peripheral portion of the top surface of the rotating part 200, so that the supports 300 may support a peripheral portion of the substrate 110. The support 300 may be shaped into a support pin, and thus a plurality of the support pins may be arranged on a circumferential line of a circle of which the diameter is smaller than that of the substrate 110. Since the support may have a height from the top surface of the rotating part 200, the substrate 100 may be spaced apart from the top surface of the rotating part 200 at least as much as the height of the support 300.

The injector 400 may be positioned on the top surface 212 of the rotating part 200 and may face a bottom surface of the substrate 110, so that the injector 400 may be located under the substrate 110. For example, the injector 400 may be positioned at a central portion of the top surface 212 of the rotating part 200. As a result, the injector 400 may be positioned on the top surface of the rotating part 200 under the substrate 110 that is spaced apart from the top surface of the rotating part 200.

In an example embodiment, the injector 400 may include a first sub-injector 410 for injecting the drying gases onto the substrate 110 and a second sub-injector 420 for injecting the etching solutions and the cleaning solutions onto the substrate 110 and a cap 430 enclosing lower portions of the first and second sub-injectors 410 and 420. For example, the first and the second sub-injectors 410 and 420 may be spaced apart from the bottom surface of the substrate 110, so that the processing materials including the etching solutions, the cleaning solutions and the drying gases may be uniformly supplied onto the bottom surface of the substrate 110 through the first and second sub-injectors 410 and 420.

The injector 400 is to be described in detail hereinafter with respect to FIGS. 3 to 5.

Figure 3:
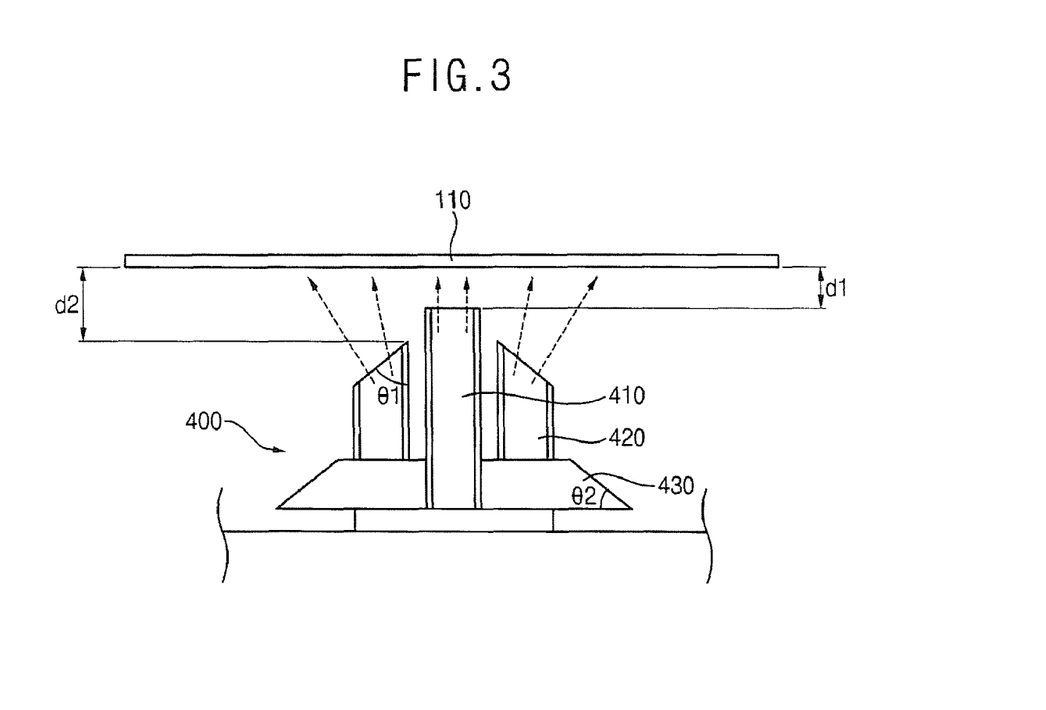
FIG. 3 is a cross-sectional view illustrating a first example embodiment of the injector of the spin unit shown in FIG. 2.
Figure 4:
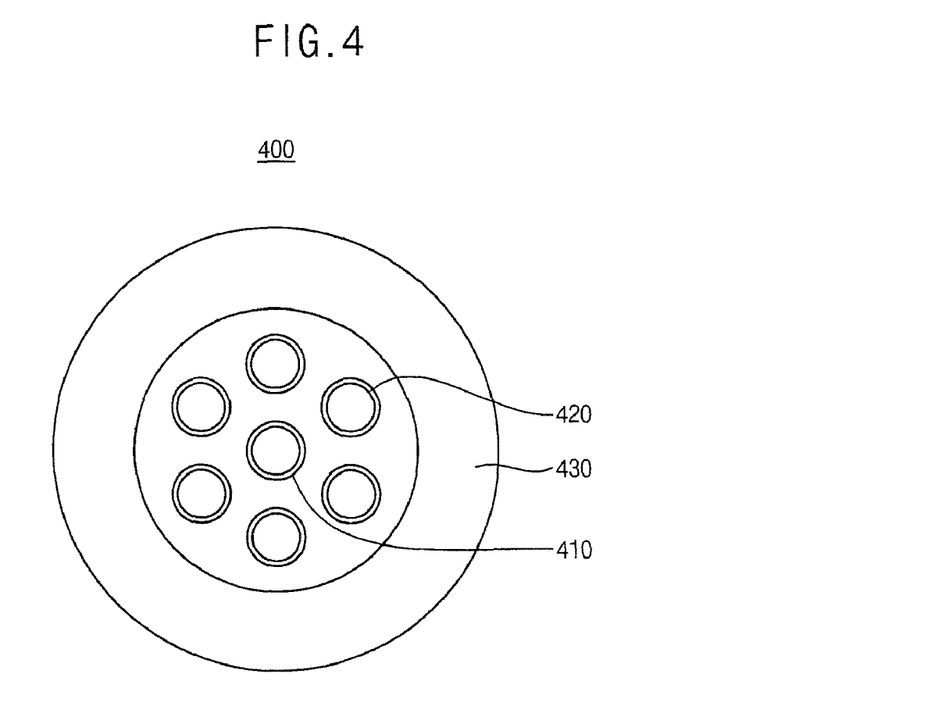
FIG. 4 is a plan view illustrating the first example embodiment of the injector shown in FIG. 3.

FIG. 3 is a cross-sectional view illustrating a first example embodiment of the injector of the spin unit shown in FIG. 2, and FIG. 4 is a plan view illustrating the first example embodiment of the injector shown in FIG. 3.

Referring to FIGS. 2 to 4, the injector 400 of the spin unit 100 in accordance with a first example embodiment of the present invention may include the first sub-injector 410 for injecting the drying gases and the second sub-injector 420 for injecting the etching solutions and the cleaning solutions, and thus the processing materials including the drying gases, the etching solutions and the cleaning solutions may be uniformly supplied onto the bottom surface of the substrate 110.

In an example embodiment, the first sub-injector 410 may be located on the top surface 212 of the rotating part 200. Particularly, the first sub-injector 410 may be positioned at a center portion of the top surface 212 and the second sub-injector 420 may be positioned at a central neighboring portion that is adjacent to the center portion of the top surface 212 of the rotating part 200. In the present example embodiment, a plurality of the second sub-injectors 420 may be positioned around and encircle the first sub-injector 410. The location of the first sub-injector 410 at the center portion of the top surface 212 of the rotating part 200 may prevent the drying gases having a relatively light weight from bounding from the bottom surface of the substrate 110, so that the drying gases may sufficiently spread out on the entire surface of the bottom surface of the substrate 110 despite the light weight thereof.

Particularly, the first sub-injector 410 may be located at the center portion of the top surface 212 of the rotating part 200 and a plurality of the second sub-injector 420 may be located around the first sub-injector 410 along a virtual circumferential line. The second sub-injector 420 may be provided in accordance with processing steps that are performed to the substrate 110. For example, the second sub-injectors 420 may be provided on the rotating part 200 respectively corresponding to the SC-1 solution, the DSP solution, the DHF solution and the deionized water. The number of the second sub-injectors 420 may be larger than that of the processing steps, so that supplementary second sub-injectors may be provided against emergencies of the failures of the second sub-injectors 420.

The first sub-injector 410 may be spaced apart from the bottom surface of the substrate 110 by a first gap distance d1 and the second sub-injector 420 may be spaced apart from the bottom surface of the substrate 110 by a second gap distance d2 different from the first gap distance d1. When the first gap distance d1 is substantially identical to the second gap distance d2, the injections through the first and the second sub-injectors 410 and 420 may be interfered with each other. For example, when the pressure of the first sub-injector 410 is lower than that of the second sub-injector 420 and the first and second sub-injectors 410 and 420 may be located at the same positions spaced apart from the substrate 110 by the same gap distance, the processing materials through the second sub-injector 420 may be sucked into the flow from the first sub-injector 410. That is, the etching solutions or the cleaning solutions injected from the second sub-injector 420 may be mixed into the drying gases from the first sub-injector 410. Therefore, the first and second sub-injectors 410 and 420 may be spaced apart from the bottom surface of the substrate 110 by different gap distances.

In an example embodiment, the second sub-injector 420 may be spaced apart from the bottom surface of the substrate 110 more than the first sub-injector 410. That is, the second gap distance d2 is greater than the first gap distance d1. For example, the ratio of the first gap distance d1 and the second gap distance d2 may be in a range of about 3:5 to about 4:5. When the ratio of the first and second gap distances d1 and d2 is less than about 2:5, the first sub-injector 410 is too close to the bottom surface of the substrate 110 and thus the drying gases injected from the first sub-injector 410 are rebounded into the first sub-injector 410. In addition, when the second sub-injector 420 is too far from the bottom surface of the substrate 110, the pressure of the second sub-injector 420 may need to be increased. Accordingly, the first gap distance d1 may be in a range of about 6 mm to about 8 mm and the second gap distance d2 may be about 10 mm.

In an example embodiment, the first and the second gap distances d1 and d2 may be controlled by a controller (not shown), respectively, so that the first and second sub-injectors 410 and 420 may be located independently from each other by the controller. In another example embodiment, the gap distances d1 and d2 of the first and second sub-injectors 410 and 420 may be adjusted by a control of the height of the support pin 300. Therefore, the gap distances of the first and second sub-injectors 410 and 420 may be varied in accordance with the size of the substrate an amount of the processing materials and an injection pressure, so that the processing materials may be effectively injected onto the substrate 110 in accordance with the kinds thereof.

The first and the second sub-injectors 410 and 420 may inject the processing materials in the same directions. For example, the processing materials may be injected onto the bottom surface of the substrate 110 in a vertical direction with respect to the bottom surface thereof through the first and second sub-injectors 410 and 420. That is, the processing materials may be injected upwards to the bottom surface of the substrate 110 through both the first and the second sub-injectors 410 and 420.

The first and the second sub-injectors 410 and 420 may also inject the processing materials at different angles with respect to the bottom surface of the substrate 110, so that the processing materials may be injected to the bottom surface of the substrate 110 in different directions. For example, the drying gases may be vertically injected onto the bottom surface of substrate 110 through the first sub-injector 410, so that the etching solutions or the cleaning solutions may be sufficiently removed from the bottom surface of the substrate 110. The etching solutions or the cleaning solutions may be injected to the bottom surface of the substrate obliquely with respect to the substrate 110 through the second sub-injector 420.

In an example embodiment, the second sub-injector 420 may have a cylindrical shape of which the upper portion is inclined downward with respect to the bottom surface of the substrate 110, so that the normal vector of an upper surface of the cylindrical second sub-injector 420 is inclined at a first angle of $\theta_1$ with respect to the bottom surface of the substrate 110. That is, the height of a sidewall of the second sub-injector 420 adjacent to the center portion of the rotating part 200 is higher than that of the sidewall of the second sub-injector 420 away from the center portion of the rotating part 200, so that the processing materials from the second sub-injector are injected onto the substrate 110 obliquely with respect to the substrate 110.

As shown in FIG. 3, the upper surface of the cylindrical second sub-injector 420 may be inclined at the first angle $\theta_1$ with respect to the sidewall of the second sub-injector 420 adjacent to the center portion of the rotating part 200, because the normal vector of an upper surface of the cylindrical second sub-injector 420 is inclined at a first angle of $\theta_1$ with respect to the bottom surface of the substrate 110. When the first angle $\theta$ is substantially identical to about 0°, the etching solutions or the cleaning solutions may be injected in a direction substantially vertical to the bottom surface of the substrate 110, so that the etching solutions or the cleaning solutions may be injected substantially in the same direction in which the drying gases are injected to the substrate 110. In addition, when the first angle $\theta$ is more than about 60°, the etching solutions or the cleaning solutions may be focused around the peripheral portion of the bottom surface of the substrate 110 to thereby deteriorate the uniformity of the injection of the etching solutions or the cleaning solutions. For those reasons, the first angle $\theta_1$ may be controlled in a range of about 0° to about 60°.

As described above, the upper surface of the cylindrical second sub-injector 420 may be inclined with respect to the bottom surface of the substrate 110, and thus the etching solutions or the cleaning solutions may be obliquely injected onto the bottom surface of the substrate 110. Therefore, the etching solutions or the cleaning solutions may be injected onto the bottom surface of the substrate 110 in a direction different from an injection direction of the first sub-injector 410, to thereby prevent the second sub-injector 420 from being clogged with the etching solutions or the cleaning solutions.

The injector 400 may further include a cap 430 enclosing lower portions of the first and second sub-injectors 410 and 420.

The cap 430 may be located at a boundary portion of the top surface 212 of the rotating part 200 and the first and second sub-injectors 410 and 420 and may be shaped into a disk. When the first and second sub-injectors 410 and 420 pass through the spin chuck 210 of the rotating part 200, the cap 430 may sufficiently seal the intervals between the spin chuck 210 and the first and second sub-injectors 410 and 420, to thereby prevent the etching solutions or the cleansing solutions from being permeated into the intervals.

In an example embodiment, a peripheral portion of the cap 430 may be inclined downward in a left-to-right hatch direction at a second angle $\theta_2$ with respect to a bottom surface of the cap 430. Accordingly, the peripheral portion of the cap 430 may be inclined obliquely toward the peripheral portion of rotating part 200.

For example, the cap 430 may have a skirt shape, and thus the sidewall of the cap 430 may be inclined at the second angle $\theta_2$ with respect to the top surface 212 of the rotating part 200, so that the rebounded processing materials from the bottom surface of the substrate 110 may flow toward the peripheral portion of the rotating part 200. That is, the rebounded etching solutions or the cleaning solutions may flow toward the peripheral portion of the substrate 110 due to the inclined sidewall of the cap 430. Therefore, the processing materials injected from the first and second sub-injectors 410 and 420 may be prevented from stacking at a lower portion of the first and the second sub-injectors 410 and 420.

According to the present example embodiment, the first and the second sub-injectors 410 and 420 may be spaced apart from the substrate 110 and the etching solutions, the cleaning solutions and the drying gases may be selectively injected onto the bottom surface of the substrate 110 through the first and second sub-injectors 410 and 420. Therefore, the processing materials may uniformly spread on the entire surface of the substrate 110. Further, the second sub-injector 420 may be inclined at an angle with respect to the bottom surface of the substrate 110, to thereby prevent the second sub-injector 420 from clogged with the rebounded processing materials.

Figure 5:
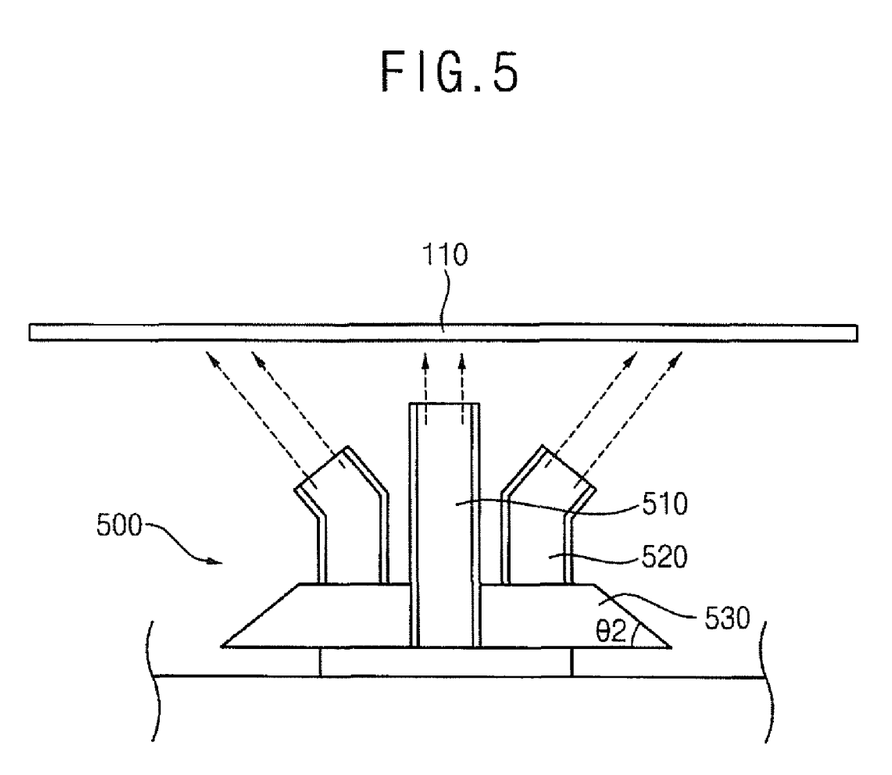
FIG. 5 is a cross-sectional view illustrating a second example embodiment the injector of the spin unit shown in FIG. 2.

FIG. 5 is a cross-sectional view illustrating a second example embodiment the injector of the spin unit shown in FIG. 2.

Referring to FIG. 5, the second example embodiment of the injector 500 may include a first sub-injector 510 for injecting drying gases and a second sub-injector 520 for injecting etching solutions and cleaning solutions.

The first sub-injector 510 may inject the drying gases in a vertical direction to the bottom surface of the substrate 110. The first sub-injector 510 may have the same structures and configurations as the first sub-injector 410 that is described in detail with reference to FIGS. 2 to 4, and thus any detailed descriptions on the first sub-injector 510 will be omitted hereinafter.

The second sub-injector 520 may inject the process materials in a direction that is different from the injection direction of the first sub-injector 510. For example, the second sub-injector 520 may inject the process materials toward the peripheral portion of the substrate 110 at an inclined angle with respect to a vertical line (a normal vector) of the substrate 110.

Therefore, the first sub-injector 510 may be located vertical to the substrate 110 and the second sub-injector 520 may be inclined toward the peripheral portion of the substrate 110.

In the present example embodiment, an injection hole of the second sub-injector 520 may be bended outward to the substrate, so that the injection hole faces the substrate 110 at the inclined angle. Accordingly, the etching solutions or the cleaning solutions may be injected toward the peripheral portion of the substrate 110 through the second sub-injector 520. As a result, the injection hole of the second sub-injector 520 may be prevented from being clogged with the etching solutions and the cleaning solutions that are rebounded from the substrate 110.

Figure 6:
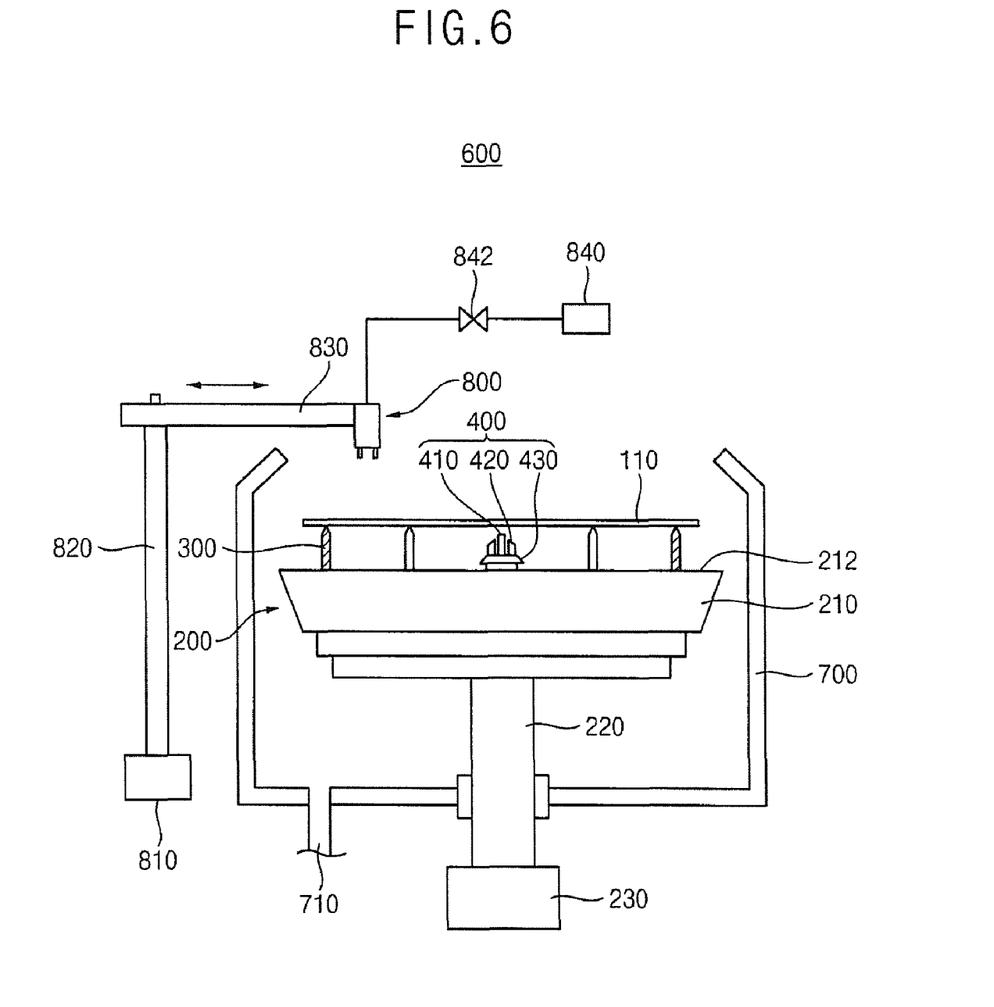
FIG. 6 is a view illustrating a schematic structure of an apparatus for processing a substrate in accordance with an example embodiment of the present example invention.

FIG. 6 is a view illustrating a schematic structure of an apparatus for processing a substrate in accordance with an example embodiment of the present example invention. The spin unit of the present example apparatus has the same structures and configurations as described with reference to FIGS. 2 to 4, and thus detailed descriptions on the spin unit will be omitted. In FIG. 6, the same reference numerals denote the same elements in FIGS. 2 to 4.

Referring to FIG. 6, the apparatus 600 for processing a substrate (hereinafter referred to as processing apparatus) may include a chamber 700 providing a space for processing the substrate 110, a spin unit 100 located in the chamber 700 and an injector 800 located over the substrate 110.

In an example embodiment, the chamber 700 may provide the space in which a series of processes are performed to the substrate 110 and may be shaped into various shapes such as a catch-cup. The chamber may prevent the processing materials being dispersed in all directions when the processes such as an etching process, a cleaning process and a drying process are performed to the substrate 110 in the chamber 700, to thereby prevent contamination to any other devices around the chamber 700 or environments of the chamber 700 due to the processing materials.

A discharge port 710 may be installed to the chamber 700 through which the processing materials may be removed from the chamber 700. For example, the discharge port 710 may pass through a bottom or a sidewall of the chamber 700.

The substrate 110 may be secured to the spin unit 100 and may be rotated on the spin unit 100. A lower injector 400 of the spin unit 100 may be spaced apart from the bottom surface of the substrate 110 and selectively inject one of the etching solutions, cleaning solutions and the drying gases onto the bottom surface of the rotating substrate 110.

An upper injector 800 may be located over the substrate 110. In an example embodiment, the upper injector 800 may electrically connected to a driver 810 through a support bar 820, which is connected to the driver 810, and an arm 830 that is connected to both the support bar 820 and the upper injector 800, so that the upper injector 800 may move over the substrate 110 by the driver 810.

A source supplier 840 may be further connected to the upper injector 800 and may include the processing materials such as etching solutions, cleaning solutions and drying gases. In addition, a control valve 842 may be installed to a pipe line between the source supplier 840 and the upper injector 800, so that the amount of the processing materials supplied into the upper injector 800 may be controlled in accordance with various processing conditions.

The upper injector 800 may inject one of the same processing materials injected through the lower injector 400 to the bottom surface of the substrate 110 onto a top surface of the substrate.

In an example embodiment, the processing materials may be injected to both the top and bottom surfaces of the substrate 110 through the lower and upper injectors 400 and 800. For example, in case of the cleaning process, the cleaning solutions may be injected onto the top surface of the substrate 110 through the upper injector 800 while the cleaning solutions may be injected onto the bottom surface of the substrate 110 through the lower injector 400. That is, the lower and upper injectors 400 and 800 may be provided for the same process.

Although the processing materials on a peripheral portion of the top surface of the substrate 110 may unexpectedly flow downward onto the bottom surface of the substrate 110, the injection through the lower injector 400 to the peripheral portion of the bottom surface may prevent the processing materials from flowing off onto the bottom surface from the top surface of the substrate 110. Accordingly, the particles caused by the flowing off of the processing materials from the top surface of the substrate 110 may be sufficiently prevented by the simultaneous injection through the lower and upper injectors 400 and 800.

According to some example embodiments of the present invention, processing materials may be supplied onto a bottom surface of a substrate. Particularly, the processing materials may be selectively injected onto the bottom surface of the substrate at a position spaced apart from the bottom surface, and thus the processing materials may be uniformly injected onto the bottom surface of the substrate.

Further, etching solutions or cleaning solutions may be injected at an inclined angle toward the peripheral portion of the substrate, to thereby prevent clogging of an injector due to the rebounded etching solutions and the cleaning solutions.

Furthermore, the particles caused by the flowing off of the processing materials from the top surface of the substrate may be sufficiently prevented by simultaneous injection through lower and upper injectors.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included less than the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific example embodiments disclosed and that modifications to the disclosed example embodiments, as well as other example embodiments, are intended to be included within the scope of the appended claims. The present invention is defined by the following claims, with equivalents of the claims to be included therein.

What is claimed is:

1. A spin unit comprising:
a rotating pair on which a substrate is rotated;
a support positioned on a peripheral portion of an upper surface of the rotating part and supporting the substrate; and
an injector positioned on the upper surface of the rotating part and spaced apart from a bottom surface of the substrate, the injector selectively injecting processing materials onto the bottom surface of the substrate while the substrate is rotated,
wherein the processing materials includes drying gases, etching solutions and cleaning solutions and the injector comprises:
a first sub-injector located at a center portion of the upper surface of the rotating part and spaced apart from a bottom surface of the substrate by a first gap distance, the drying gases being injected onto the bottom surface of the substrate through the first sub-injector; and
a second sub-injector located at a central neighboring portion of the upper surface of the rotating part and spaced apart from the bottom surface of the substrate by a second gap distance, the etching solutions and the cleaning solutions being injected onto the bottom surface of the substrate through the second sub-injector, wherein the second gap distance is greater than the first gap distance.

2. The spin unit of claim 1, wherein a ratio of the first and the second gap distance is in a range of about 1:2 to about 1:4.

3. The spin unit of claim 1, wherein the first and second gap distances are respectively controlled independently from each other.

4. The spin unit of claim 1, wherein a plurality of the second sub-injectors is located around the first sub-injector, so that the first sub-injector is enclosed by the second sub-injectors.

5. The spin unit of claim 1, wherein the first and the second sub-injectors inject the processing materials onto the bottom surface of the substrate in a direction substantially vertical to the substrate.

6. The spin unit of claim 1, wherein the drying gases are injected through the first sub-injector in a first direction and the etching solutions and the cleaning solutions are injected through the second sub-injector in a second direction different from the first direction.

7. The spin unit of claim 1, wherein the injector further includes a cap enclosing lower portions of the first and second sub-injectors of the injector, so that the processing materials that are injected through the injector are prevented from remaining at the lower portions of the first and second sub-injectors after rebounding from the substrate.

8. The spin unit of claim 7, wherein a peripheral portion of the cap is inclined downward in a left-to-right batch direction at an angle with respect to a bottom surface of the cap.

9. The spin unit of claim 1 wherein the first sub-injector is spaced apart from the second sub-injector.

10. An apparatus for processing a substrate, comprising:
a spin unit including a rotating part on which a substrate is rotated, a support positioned on a peripheral portion of an upper surface of the rotating part and supporting the substrate, and a lower injector positioned on the upper surface of the rotating part and spaced apart from a bottom surface of the substrate, the lower injector selectively supplying processing materials onto the bottom surface of the substrate while the substrate is rotated; and
an upper injector located over the substrate, the processing materials being selectively supplied onto a top surface of the substrate through the upper injector while the substrate is rotated,
wherein the processing materials includes drying gases, etching solutions and cleaning solutions and the lower injector includes: a first sub-injector located at a center portion of the upper surface of the rotating part and spaced apart from a bottom surface of the substrate by a first gap distance, the drying gases being injected onto the bottom surface of the substrate through the first sub-injector; and a second sub-injector located at a central neighboring portion of the upper surface of the rotating part and spaced apart from the bottom surface of the substrate by a second gap distance, the etching solutions and the cleaning solutions being injected onto the bottom surface of the substrate through the second sub-injector,
wherein the second gap distance is greater than the first gap distance.

11. The apparatus of claim 10, wherein the lower injector further includes a cap enclosing lower portions of the first and the second sub-injectors of the injector and of which a peripheral portion is inclined downward in a left-to-right hatch direction at an angle with respect to a bottom surface of the cap, so that the processing materials that are injected through the injector are prevented from remaining at the lower portions of the first and the second sub-injectors after rebounding from the substrate.

12. The apparatus of claim 11, wherein the lower and the upper injectors simultaneously inject the processing materials onto the bottom surface and the top surface of the substrate, respectively.

13. The apparatus of claim 10 wherein the first sub-injector is spaced apart from the second sub-injector.

* * * * *